United States Patent
Wang et al.

(10) Patent No.: US 10,424,943 B2
(45) Date of Patent: Sep. 24, 2019

(54) MOBILE POWER SOURCE

(71) Applicant: EcoFlow Technology Limited, Shenzhen (CN)

(72) Inventors: Lei Wang, Shenzhen (CN); Fan Zheng, Shenzhen (CN)

(73) Assignee: EcoFlow Technology Limited, Shenzhen (CN)

(*) Notice: Subject to any disclaimer, the term of this patent is extended or adjusted under 35 U.S.C. 154(b) by 149 days.

(21) Appl. No.: 15/807,167

(22) Filed: Nov. 8, 2017

(65) Prior Publication Data

US 2019/0058333 A1 Feb. 21, 2019

(30) Foreign Application Priority Data

Aug. 18, 2017 (CN) ............... 2017 2 1045322 U

(51) Int. Cl.
| | |
|---|---|
| *H05K 5/02* | (2006.01) |
| *H02J 7/00* | (2006.01) |
| *B65D 43/16* | (2006.01) |
| *B65D 25/54* | (2006.01) |
| *F21V 33/00* | (2006.01) |
| *G09F 23/00* | (2006.01) |

(52) U.S. Cl.
CPC ............ *H02J 7/0004* (2013.01); *B65D 25/54* (2013.01); *B65D 43/163* (2013.01); *F21V 33/0004* (2013.01); *H02J 7/0027* (2013.01); *H02J 7/0047* (2013.01); *H02J 7/0054* (2013.01); *H02J 7/0055* (2013.01); *H05K 5/0217* (2013.01); *G09F 2023/0025* (2013.01); *H02J 7/0013* (2013.01); *H02J 7/0044* (2013.01)

(58) Field of Classification Search
CPC ........ G06F 1/181; H05K 5/0217; H05K 5/03; H05K 7/02; H05K 7/023
See application file for complete search history.

(56) References Cited

U.S. PATENT DOCUMENTS 5,613,237 A * 3/1997 Bent ............... H04B 1/086
220/4.02
5,909,357 A * 6/1999 Orr ................. G06F 1/16
361/679.46

(Continued)

OTHER PUBLICATIONS

U.S. Appl. No. 15/806,974, filed Nov. 8, 2017, Ma et al.
U.S. Appl. No. 15/807,091, filed Nov. 8, 2017, Zheng et al.
U.S. Appl. No. 15/807,131, filed Nov. 8, 2017, Ma et al.

*Primary Examiner* — Adrian S Wilson
(74) *Attorney, Agent, or Firm* — Kagan Binder, PLLC

(57) ABSTRACT

A mobile power source includes a housing, a connecting plate, a battery assembly, and a circuit board. The housing includes a hollow middle housing having openings at an upper end and a lower end thereof, and an upper cover and a lower cover latched to the openings at the upper end and the lower end, respectively. The middle housing is provided with a plurality of pillars spaced along a vertical direction at an inner side wall thereof. The connecting plate abuts against the support surface and is fixed to the plurality of pillars. The battery assembly is disposed in the housing, which includes a battery pack, and an upper support member and a lower support member disposed at an upper end and a lower end of the battery pack, respectively. The circuit board is disposed on the upper support member.

10 Claims, 8 Drawing Sheets

(56) References Cited

U.S. PATENT DOCUMENTS

| | | | | |
|---|---|---|---|---|
| 6,111,760 | A * | 8/2000 | Nixon | H05K 5/0013 220/4.02 |
| 6,315,142 | B1 * | 11/2001 | Kitamura | H04M 1/0252 220/324 |
| 7,209,195 | B2 * | 4/2007 | Lin | G02F 1/133308 349/58 |
| 7,712,621 | B2 * | 5/2010 | Cho | H05K 5/0213 220/4.28 |
| 2013/0043827 | A1 * | 2/2013 | Weinstein | H02J 7/0027 320/103 |
| 2013/0183562 | A1 * | 7/2013 | Workman | H01M 2/1022 429/100 |
| 2013/0294040 | A1 * | 11/2013 | Fukumasu | H02M 1/44 361/752 |
| 2014/0362519 | A1 * | 12/2014 | Degner | G06F 1/20 361/679.46 |
| 2015/0264831 | A1 * | 9/2015 | Yang | H05K 5/0013 361/752 |
| 2016/0197504 | A1 * | 7/2016 | Hsia | H02J 7/0045 307/23 |
| 2019/0012284 | A1 * | 1/2019 | Ma | G06F 13/385 |
| 2019/0013680 | A1 * | 1/2019 | Zheng | H02J 7/0019 |
| 2019/0013686 | A1 * | 1/2019 | Ma | H02J 7/0027 |

* cited by examiner

MOBILE POWER SOURCE

CROSS REFERENCE TO RELATED APPLICATION

This application claims priority under 35 U.S.C. § 119 to Chinese Patent Application No. 201721045322.3, filed on Aug. 18, 2017, the entire content of which is incorporated herein by reference in its entirety.

FIELD OF THE INVENTION

The present disclosure relates to the technical field of charging equipment, and more particularly relates to a mobile power source.

BACKGROUND OF THE INVENTION

Mobile power source, also known as charge bank or travel charger, is a portable charger that integrates supplying power and charging functions. Many electronic products, such as mobile phones, tablet computers and other digital devices can use the mobile power source to charge anytime and anywhere, thereby bringing many convenience to people.

The current mobile power source, particularly the mobile power source with larger capacity has a complex structure, which has many components overall. Therefore, the assembly and disassembly operations are more complex, and the daily maintenance is more inconvenient.

SUMMARY

According to various embodiments of the present disclosure, it is necessary to provide a mobile power source, which has a simple structure and is easy to disassembly and assembly.

A mobile power source includes:

a housing, the housing includes a hollow middle housing having openings at an upper end and a lower end thereof, and an upper cover and a lower cover latched to the openings at the upper end and the lower end, respectively. The middle housing is provided with an input interface and a plurality of output interfaces. The middle housing is provided with a plurality of pillars spaced along a vertical direction at an inner side wall thereof. Upper ends of the plurality of pillars are spaced from the upper end of the middle housing, and lower ends of the plurality of pillars are spaced from the lower end of the middle housing. The upper ends of the plurality of pillars cooperatively form a support surface, and the lower ends of plurality of pillars cooperatively form a limiting surface;

a connecting plate abutting against the support surface and fixed to the plurality of pillars. The upper cover is detachably connected to the connecting plate;

a battery assembly disposed in the housing, the battery assembly includes a battery pack, and an upper support member and a lower support member disposed at an upper end and a lower end of the battery pack, respectively. The upper support member is fixed to the connecting plate via a first connecting member. The lower support member extends along a horizontal direction to form a mounting edge having a size profile adapted to the middle housing. The mounting edge abuts against the limiting surface and is fixed to the pillar via a second connecting member. The lower cover is connected to the lower support member; and a circuit board disposed on the upper support member. The battery pack, the input interface, and the output interface are electrically coupled to the circuit board, respectively.

These and other objects, advantages, purposes and features will become apparent upon review of the following specification in conjunction with the drawings.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. The accompanying drawings in the following description are only some embodiments of the present invention, and persons of ordinary skill in the art can derive other obvious variations from the accompanying drawings without creative efforts.

DETAILED DESCRIPTION OF THE EMBODIMENTS

Figure 1:
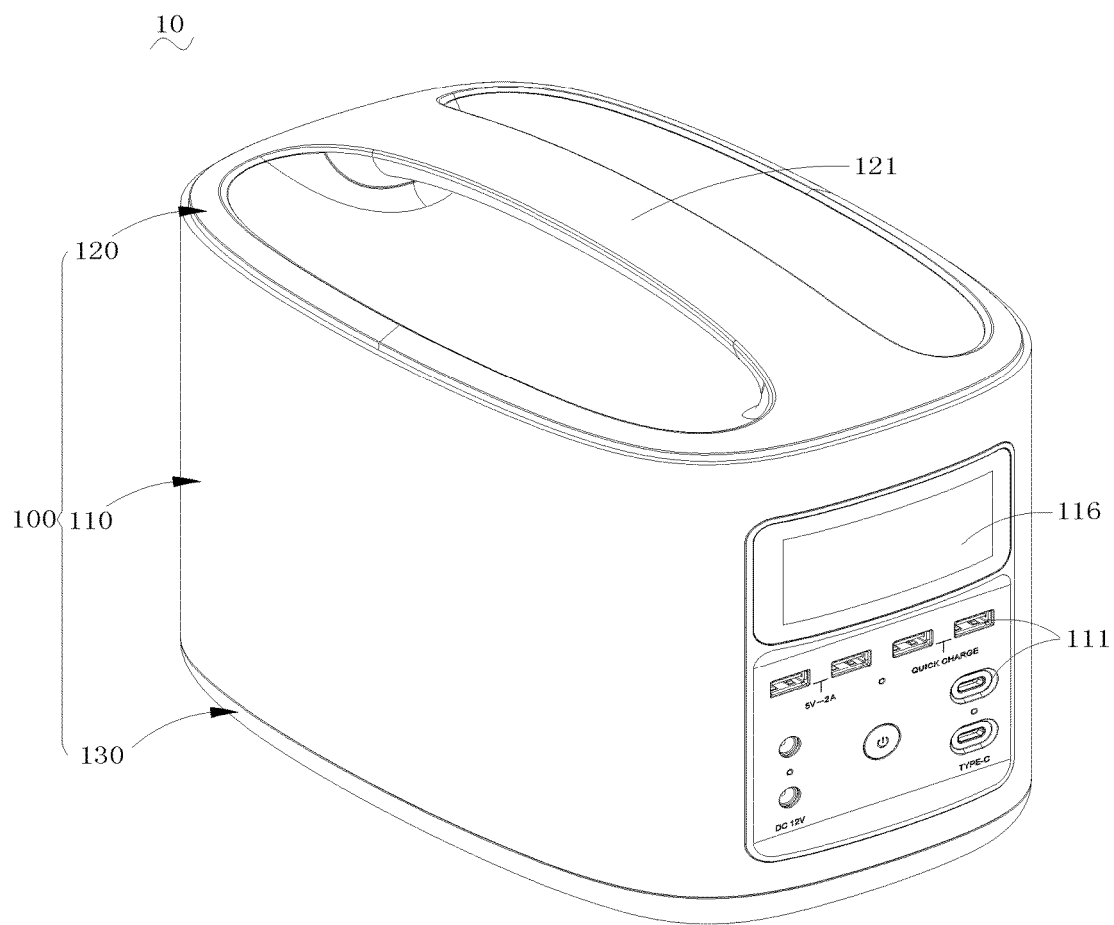
FIG. 1 is a perspective view of a mobile power source according to an embodiment.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present. As used herein, the terms "left", "right" and similar expressions used herein is for the purpose of describing particular embodiments only and is not intended to be limiting of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" as used herein includes any and all combinations of one or more of the associated listed items.

Figure 2:
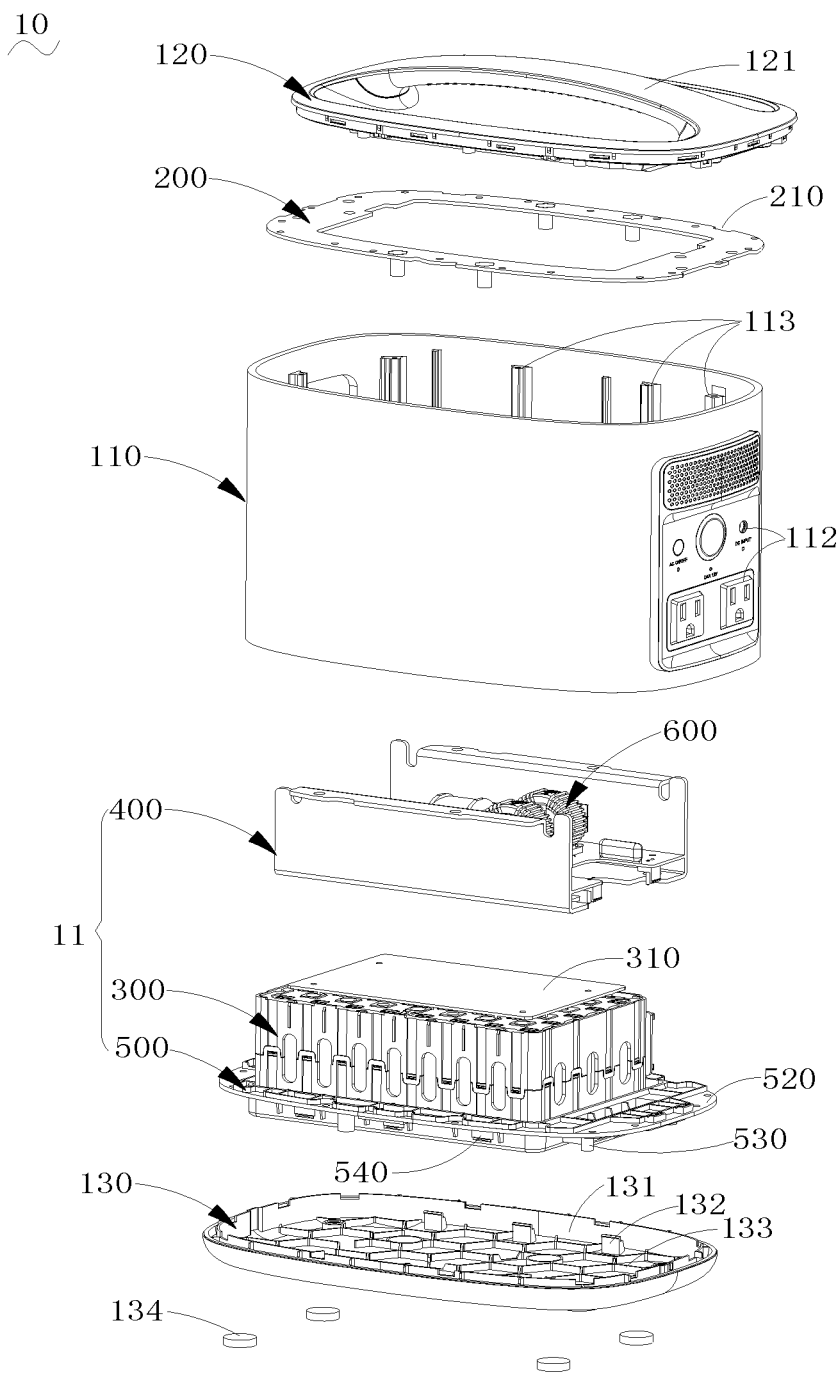
FIG. 2 is an exploded view of the mobile power source of FIG. 1.

Referring to FIG. 1 and FIG. 2, a mobile power source 10 according to an embodiment includes a housing 100, a connecting plate 200 disposed in the housing 100, a battery assembly 11, and a circuit board 600.

Figure 3:
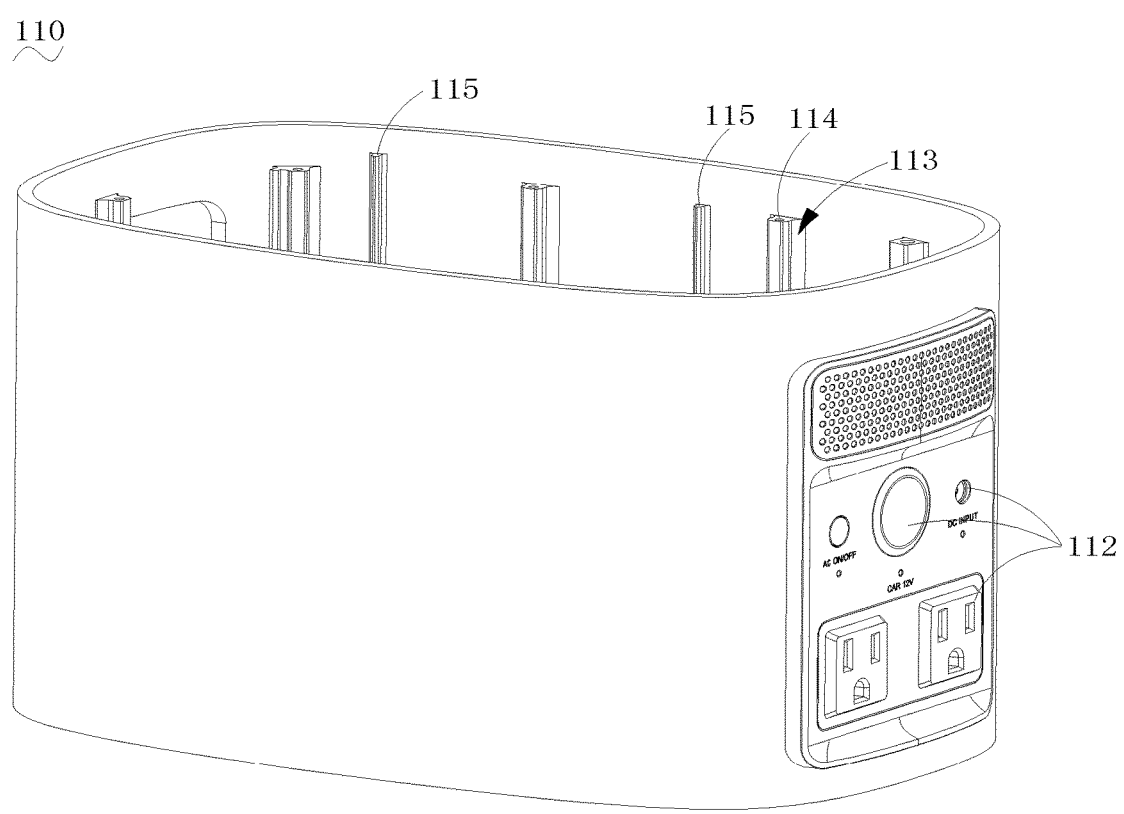
FIG. 3 is a perspective view of the middle housing of the mobile power source of FIG. 1.
Figure 4:
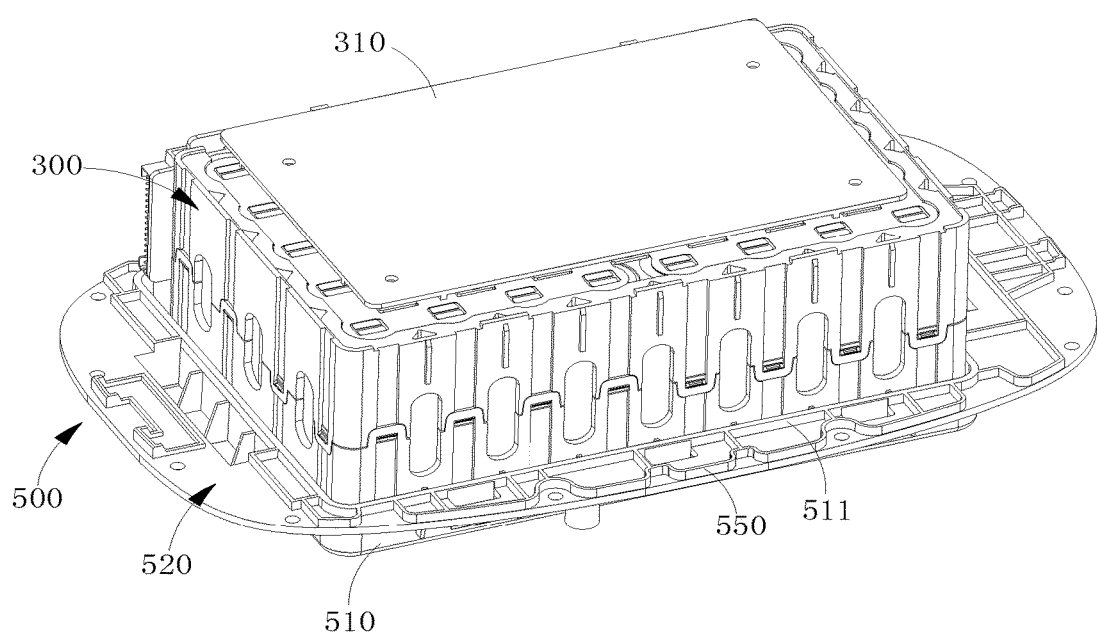
FIG. 4 is a partial schematic view of the battery assembly of the mobile power source of FIG. 2.
Figure 5:
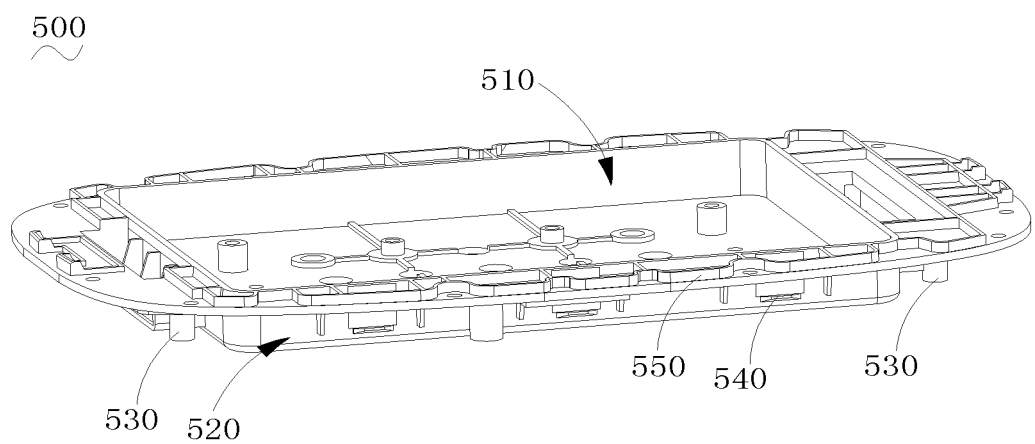
FIG. 5 is a perspective view of the lower support member of the mobile power source of FIG. 2.
Figure 6:
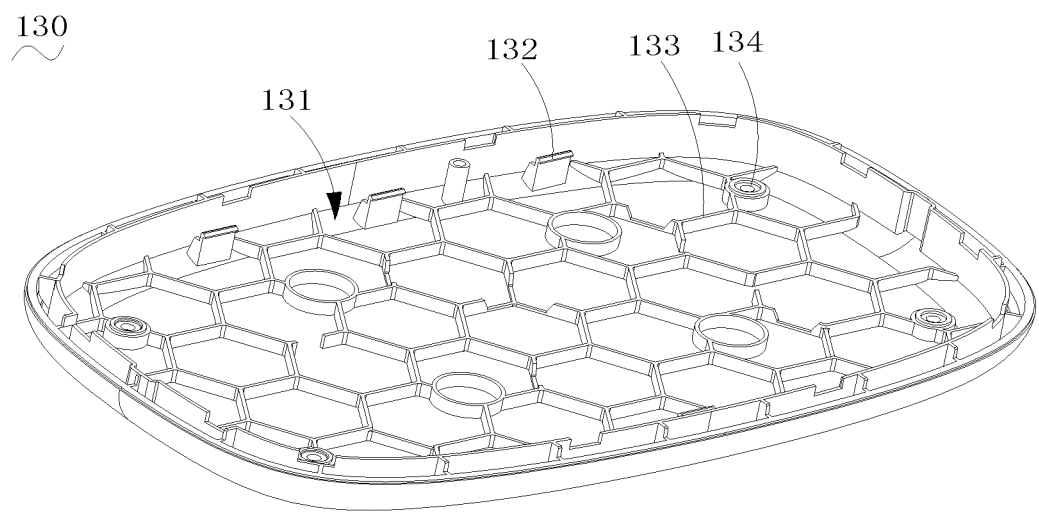
FIG. 6 is a perspective view of the lower cover of the mobile power source of FIG. 2.

Referring to FIG. 1 to FIG. 3, the housing 100 has substantially a box shape as a whole, the housing 100 includes a middle housing 110, an upper cover 120, and a lower cover 130. The middle housing 110 has a hollow structure and has openings at an upper end and a lower end thereof. The upper cover 120 and the lower cover 130 are detachably connected to the openings of the upper end and the lower end, respectively. The middle housing 110 is provided with an input interface 112 and a plurality of output interfaces 111 at a side wall thereof, wherein the input interface 112 is configured to charge the battery assembly 11, and the plurality of output interfaces 111 are configured to charge the external device.

Figure 7:
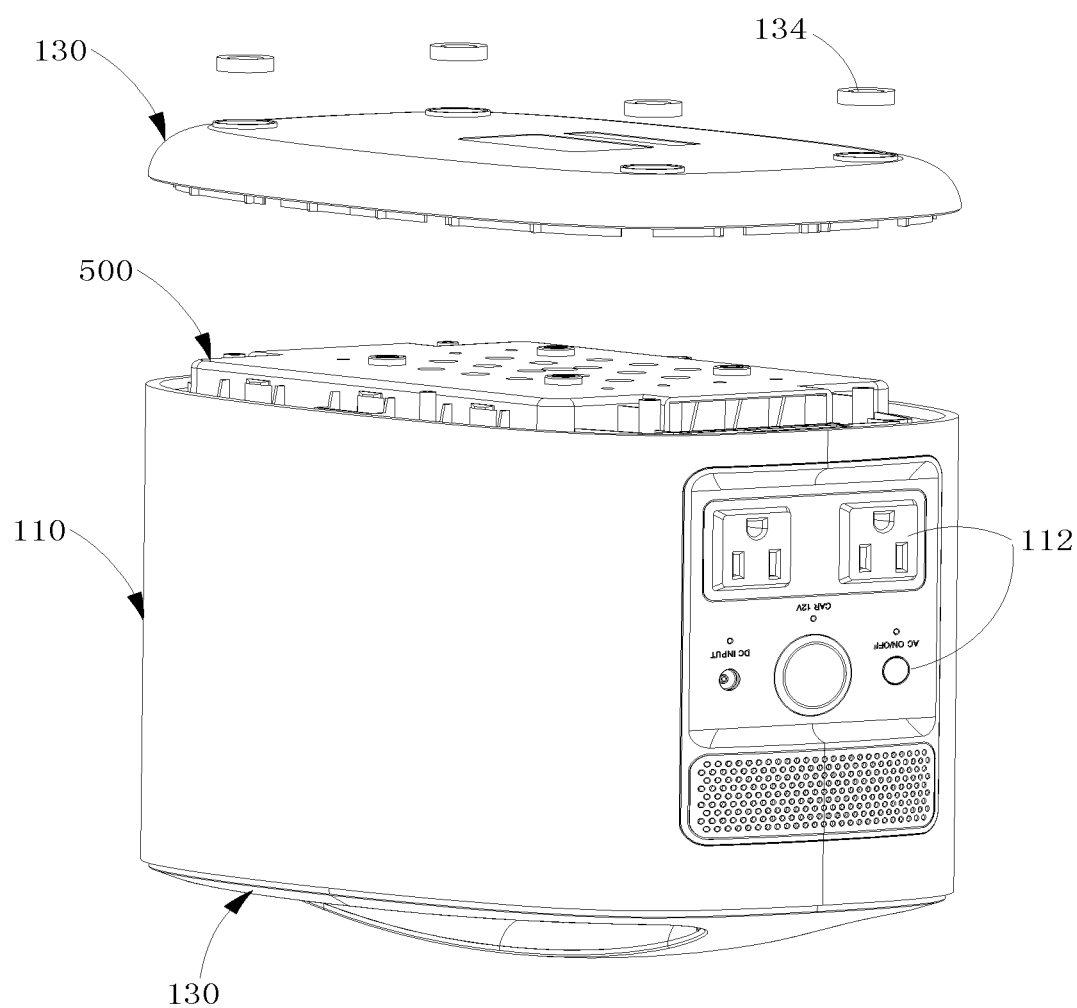
FIG. 7 is a partial exploded view of the mobile power source of FIG. 1.

Referring to FIG. 1, FIG. 3, and FIG. 7, the middle housing 110 has four side walls, and the input interface 112 and the output interface 111 can be disposed on two opposite side walls, respectively. The output interface 111 includes at least one of a universal serial bus (USB) interface, a quick charge interface based on a quick charge protocol, a Type-C interface, and a circular charge interface. The input interface 112 includes at least one of a direct current power input interface 112, an alternating current power input interface, an on-board input interface 112, and 2P/3P receptacle. Some gradually antiquated, less frequently used, or slowly charged interfaces may be disposed on the side wall having the input interface 112. For example, the circular charge interface may be disposed on the side wall having the input interface 112. 2P/3P receptacle can be directly used to supply power for external electronic equipment such as fans, musical instruments. Two jacks therein can also be used to charge the electronic device connected with an adapter.

The middle housing 110 is provided with a plurality of pillars 113 spaced along a vertical direction at the inner side wall thereof. Upper ends of the plurality of pillars 113 are spaced from the upper end of the middle housing 110, and lower ends of the plurality of pillars 113 are spaced from the lower end of the middle housing 110. The upper ends of the plurality of pillars 113 cooperatively form a support surface, and the lower ends of the plurality of pillars 113 cooperatively form a limiting surface. The pillars 113 defines threaded holes 114 at an upper end surface and a lower end surface thereof. In one embodiment, the pillar 113 has an arc surface facing an inner side of the middle housing 110, such that the operator or the mounted components will not be bumped or scratched by the pillar when the components in the middle housing 110 are mounted.

Figure 8:
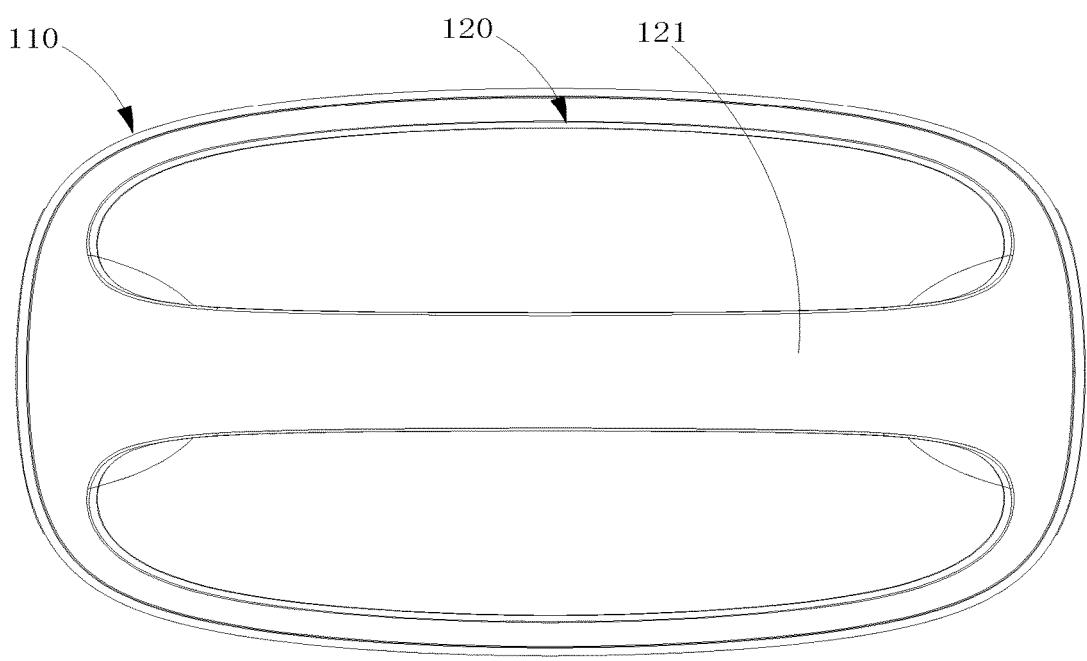
FIG. 8 is a top plan view of the mobile power source of FIG. 1.

Referring to FIG. 1 and FIG. 8, in one embodiment, the middle housing 110 has an annular cross section. Outer side walls of the middle housing 110 have no corners, i.e., the outer side walls are smoothly transitioned, which can effectively avoid scratching the user or scratching other objects during transporting or using, such that the overall appearance is more beautiful.

The connecting plate 200 abuts against the support surface and is fixed to the plurality of pillars 113. The upper cover 120 and the connecting plate 200 can be connected and fixed via a screw. The battery assembly 11 is disposed in the housing 100, which includes a battery pack 300, an upper support member 400, and a lower support member 500. The upper support member 400 is fixed to the connecting plate 200 via a first connecting member (not shown), and the lower support member 500 extends along a horizontal direction to form a mounting edge 520 having a size profile adapted to the middle housing 110. The mounting edge 520 abuts against the limiting surface and is fixed to the pillar 113 via a second connecting member (not shown). The lower cover 130 is connected to the lower support member 500.

The middle housing 110 is provided with a plurality of positioning bars 115 at the inner side wall thereof. The connecting plate 200 defines a plurality of positioning grooves 210 at a corresponding position on an outer periphery thereof. The positioning groove 210 is used cooperatively with the positioning bar 115, such that the connecting plate 200 can be easily placed in the middle housing 110.

The circuit board 600 is disposed on the upper support member 400. The circuit board 600 will not touched by other components when the upper support member 400 is mounted and fixed below the connecting plate 200. The battery pack 300, the input interface 112, and the output interface 111 are electrically coupled to the circuit board 600, respectively.

Referring to FIG. 1 and FIG. 2, in one embodiment, a side wall of the middle housing 110 provided with the output interface 111 is provided with a display screen 116. The display screen 116 is electrically coupled to the circuit board 600, which is configured to display the current status of use of the mobile power source 10, for example, a charging situation when the mobile power source 10 is charged, and a situation when the mobile power source 10 charges each external device. The display screen 116 may be provided at a top end adjacent to the middle housing 110, and is located above all the output interfaces 111. The mobile power source 10 is also provided with a handle 121 on a top surface of the upper cover 120 thereof.

The middle housing 110 is made of metals, for example aluminum, which has a good heat dissipation performance. Both of the upper cover 120 and the lower cover 130 are made of insulating materials, for example, plastic materials. Both of the upper support member 400 and the lower support member 500 are insulating members, for example, integrated injection molded parts. Both of the first connecting member and the second connecting member may use screws.

Referring to FIG. 2, and FIG. 4 to FIG. 7, in one embodiment, the lower support member 500 defines an accommodating cavity 510. At least a portion of the battery pack 300 is located in the accommodating cavity 510, and the battery pack 300 is connected and fixed to the upper support member 400 via a fixing plate 310. The battery pack 300 is a plurality of side-by-side battery packs wrapped with a waterproof adhesive layer outside, and the battery pack 300 has a substantially rectangular cross-section as a whole. A side wall of the accommodating cavity 510 extends upwardly to form an extending wall 511. An upper surface and the lower surface of the mounting edge 520 are provided with a plurality of reinforcing ribs 550, and the reinforcing rib 550 extends to the extending wall 511.

The lower cover 130 defines an accommodating groove 131, and the overall shape and profile of the accommodating groove 131 are adapted to the accommodating cavity 510. The lower cover 130 is provided with a plurality of reinforcing ribs 133 protruding from a bottom surface of the accommodating groove 131. The plurality of reinforcing ribs 133 are staggered so as to increase safety and reliability of the lower cover 130. A bottom wall of the accommodating cavity 510 extends into the accommodating groove 131 and abuts against a portion of the plurality of reinforcing ribs 133. Cylindrical adjustable feet 134 are embedded in each of the through holes of the lower cover 130, respectively. A portion of the adjustable feet protrudes to a bottom surface of the lower cover.

The mounting edge 520 is provided with four connecting posts 530 at a bottom surface thereof, which are adjacent to four corners, respectively. Each of the connecting posts 530 has an internal thread, the lower cover 130 defines a through hole 134 at a corresponding position. The second connecting member uses an endedscrew, which extends through the through hole 134 and then is threadedly connected to the connecting post 530.

In one embodiment, a latching structure is also provided between the lower cover 130 and the lower support member 500. The bottom surface of the accommodating groove 131 is provided with a plurality of elastic buckles 132, and an outer side wall of the accommodating cavity 510 defines a plurality of latching grooves 540. The plurality of elastic buckles 132 are corresponding to the plurality of latching grooves 540, and the elastic buckle 132 is used cooperatively with the latching groove 540. After one end of the lower cover 130 is latched into the middle housing 110, the lower cover 130 may be initially fixed by the engagement of the elastic buckle 132 with the latching groove 540, and then the lower cover 130 is further fixed to the lower support member 500 via the endedscrew, such that the installation is more convenient and the structure after the installation is more stable.

Referring to FIG. 2 to FIG. 7, in assembly of the mobile power supply 10, the connecting plate 200 is firstly placed on the support surface formed by the plurality of pillars 113, and the connecting plate 200 is fixed to the support surface via screws. Then, one end of the upper cover 120 is latched to the opening of the upper end of the middle housing 110, and the upper cover 120 is fixed to the connecting plate 200 via screws. The battery assembly 11 and the circuit board 600 are placed into the middle housing 110, and the circuit board 600 and the battery assembly 11 are integrally fixed to the connecting plate 200 via screws. Meanwhile, a connection wire or a connection terminal led from the battery assembly 11 and the circuit board 600 is connected to the corresponding output interface 111 or input interface 112. The mounting edge 520 is fixed to the limiting surface at a bottom end of the pillars 113 via the endedscrew. One end of the lower cover 130 is latched to the opening at the bottom of the middle housing 110, and the lower cover 130 is continued to advance into the middle housing 110, then the lower cover 130 is latched to the lower support member 500 via the latching structure. Finally, the lower cover 130 is further fixed to the lower support member 500 via screws, thereby completing the assembly of the mobile power supply 10.

In the aforementioned mobile power source 10, the middle housing 110 is provided with a plurality of pillars 113 at the inner side wall thereof, the upper cover 120 is connected to the connecting plate 200 abutting against the support surface after latched to the middle housing 110, the lower cover 130 is detachably connected to the lower support member 500 after latched to the middle housing 110. Therefore, the upper support member 400 and the lower support member 500 of the battery assembly 11 are easy to assemble and disassemble. The overall structure is simple and easy to assemble and disassemble, which is capable of forming stable structure, thereby facilitating daily maintenance.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A mobile power source, comprising:
a housing, the housing comprising a hollow middle housing having openings at an upper end and a lower end thereof, and an upper cover and a lower cover latched to the openings at the upper end and the lower end, respectively, wherein the middle housing is provided with an input interface and a plurality of output interfaces, the middle housing is provided with a plurality of pillars spaced along a vertical direction at an inner side wall thereof, upper ends of the plurality of pillars are spaced from the upper end of the middle housing, lower ends of the plurality of pillars are spaced from the lower end of the middle housing, the upper ends of the plurality of pillars cooperatively form a support surface, the lower ends of the plurality of pillars cooperatively form a limiting surface;
a connecting plate abutting against the support surface and fixed to the plurality of pillars, the upper cover being detachably connected to the connecting plate;
a battery assembly disposed in the housing, the battery assembly comprising a battery pack, and an upper support member and a lower support member disposed at an upper end and a lower end of the battery pack, respectively, wherein the upper support member is fixed to the connecting plate via a first connecting member, the lower support member extends along a horizontal direction to form a mounting edge having a size profile adapted to the middle housing, the mounting edge abuts against the limiting surface and is fixed to the pillar via a second connecting member, the lower cover is connected to the lower support member; and
a circuit board disposed on the upper support member, the battery pack, the input interface, and the output interface are electrically coupled to the circuit board, respectively.

2. The mobile power source according to claim 1, wherein the lower support member defines an accommodating cavity, one portion of the battery pack is located in the accommodating cavity, and the other portion of the battery pack protrudes from the accommodating cavity.

3. The mobile power source according to claim 2, wherein the lower cover defines an accommodating groove, the lower cover is provided with a plurality of staggered reinforcing ribs protruding from a bottom surface of the accommodating groove, a bottom wall of the accommodating cavity extends into the accommodating groove and abuts against a portion of the plurality of reinforcing ribs.

4. The mobile power source according to claim 3, wherein the mounting edge is provided with four connecting posts at a bottom surface thereof, which are adjacent to four corners, respectively, the connecting post has an internal thread, the lower cover defines a through hole at a corresponding position, the second connecting member is an endedscrew extending through the through hole and engaged with the connecting post.

5. The mobile power source according to claim 4, wherein cylindrical adjustable feet are embedded in each of the through holes of the lower cover, respectively, a portion of the adjustable feet protrudes to a bottom surface of the lower cover.

6. The mobile power source according to claim 3, wherein a latching structure is provided between the lower cover and the lower support member.

7. The mobile power source according to claim 6, wherein the bottom surface of the accommodating groove is provided with a plurality of elastic buckles, an outer side wall of the accommodating cavity defines a plurality of latching grooves, the plurality of elastic buckles are latched in the plurality of latching grooves.

8. The mobile power source according to claim 1, wherein the pillar has an arc surface facing an inner side of the middle housing.

9. The mobile power source according to claim 1, wherein a side wall of the middle housing provided with the plurality of output interfaces is provided with a display screen, the display screen is electrically coupled to the circuit board to display a current status of use of the mobile power source.

10. The mobile power source according to claim 1, wherein the middle housing is an aluminum housing, the upper cover and the lower cover are plastic covers.

* * * * *